United States Patent
Chang et al.

(10) Patent No.: US 9,839,157 B2
(45) Date of Patent: Dec. 5, 2017

(54) LIQUID COOLING APPARATUS

(71) Applicant: MSI Computer (Shenzhen) Co., Ltd., Shenzhen (CN)

(72) Inventors: Hung Chang, New Taipei (TW); Min-Lang Chen, New Taipei (TW); Hsueh-Lung Cheng, New Taipei (TW)

(73) Assignee: MSI Computer (Shenzhen) Co., Ltd., Shenzhen, Gauangdong Province (CN)

( * ) Notice: Subject to any disclaimer, the term of this patent is extended or adjusted under 35 U.S.C. 154(b) by 318 days.

(21) Appl. No.: 14/664,272

(22) Filed: Mar. 20, 2015

(65) Prior Publication Data
US 2016/0205807 A1    Jul. 14, 2016

(30) Foreign Application Priority Data
Jan. 9, 2015    (TW) .............................. 104200406 U

(51) Int. Cl.
| | |
|---|---|
| H05K 7/20 | (2006.01) |
| H01L 23/00 | (2006.01) |
| H01L 23/473 | (2006.01) |
| F28D 11/02 | (2006.01) |
| F28D 15/00 | (2006.01) |
| F28D 15/02 | (2006.01) |

(52) U.S. Cl.
CPC ......... *H05K 7/20218* (2013.01); *F28D 11/02* (2013.01); *F28D 15/00* (2013.01); *H01L 23/00* (2013.01); *H01L 23/473* (2013.01); *F28D 15/0208* (2013.01); *F28D 15/0266* (2013.01)

(58) Field of Classification Search
CPC ........ H05K 7/20; H05K 7/20218; G06F 1/20; H01L 23/00; H01L 23/473; H01L 23/467; F28D 11/00; F28D 15/00; F28D 15/0208; F28D 15/0266
USPC ...... 165/80.2, 80.3, 80.4; 361/699, 701, 702
See application file for complete search history.

(56) References Cited

U.S. PATENT DOCUMENTS

| | | | | |
|---|---|---|---|---|
| 5,406,807 | A * | 4/1995 | Ashiwake | H01L 23/427 165/908 |
| 5,815,370 | A * | 9/1998 | Sutton | H05K 7/20281 165/80.4 |
| 6,014,238 | A * | 1/2000 | McDunn | H04B 10/11 361/752 |
| 7,743,818 | B2 * | 6/2010 | Liu | H01L 23/427 165/104.21 |
| 7,869,714 | B2 * | 1/2011 | Patel | H04B 10/803 361/677 |
| 7,885,072 | B2 * | 2/2011 | Wu | H01L 23/4006 165/104.33 |

(Continued)

*Primary Examiner* — Len Tran
*Assistant Examiner* — Gustavo Hincapie Serna
(74) *Attorney, Agent, or Firm* — Muncy, Geissler, Olds & Lowe, P.C.

(57) ABSTRACT

A liquid cooling apparatus includes a heat exchange module and a cooling module. The heat exchange module includes a liquid outlet and a liquid outlet. The cooling module includes a first body, a second body, a first cooling component and a cooling duct. The first body is connected to the liquid outlet. The second body is connected to the liquid outlet, and the first body is disposed above the second body. The first cooling component is disposed between the first body and the second body. The cooling duct is connected to the first body and the second body, and the cooling duct is in thermal contact with the first cooling component.

13 Claims, 7 Drawing Sheets

(56) References Cited

U.S. PATENT DOCUMENTS

| | | | | |
|---|---|---|---|---|
| 8,596,836 B2* | 12/2013 | Pedersen | ............... | F21V 21/30 |
| | | | | 362/249.02 |
| 2007/0070604 A1* | 3/2007 | Tomioka | ............ | F28D 1/05325 |
| | | | | 361/696 |
| 2007/0171608 A1* | 7/2007 | Hsu | ................ | H01L 23/427 |
| | | | | 361/679.54 |
| 2008/0169086 A1* | 7/2008 | Hu | ................ | F28D 1/05366 |
| | | | | 165/80.4 |
| 2013/0068424 A1* | 3/2013 | Hwang | ............... | F28F 3/02 |
| | | | | 165/104.19 |
| 2013/0077245 A1* | 3/2013 | Gradinger | ............ | F28D 1/035 |
| | | | | 361/700 |
| 2013/0107455 A1* | 5/2013 | Cottet | ............... | H05K 7/20672 |
| | | | | 361/694 |
| 2014/0215845 A1* | 8/2014 | Corver | ............... | F26B 5/06 |
| | | | | 34/284 |

* cited by examiner

LIQUID COOLING APPARATUS

CROSS-REFERENCE TO RELATED APPLICATIONS

This non-provisional application claims priority under 35 U.S.C. §119(a) on Patent Application No(s). 104200406 filed in Taiwan, R.O.C. on Jan. 9, 2015, the entire contents of which are hereby incorporated by reference.

TECHNICAL FIELD

The disclosure relates to a liquid cooling apparatus, and more particularly to a cooling apparatus for improving cooling efficiency and saving energy.

BACKGROUND

In order to pursue superior performance of computers, operating speeds of electronic components of computers have been improved significantly by manufacturers. However, the electronic components generate lots of high-temperature heat due to the high operating speeds thereof, thereby reducing operating efficiency of the electronic components. Accordingly, cooling devices are provided for removing high-temperature heat from the electronic components. Therefore, cooling devices, such as liquid cooling apparatuses, have widely been applied.

In general, a pump is provided for driving cooling liquid circulated within a cooling system, in order to remove heat from the electronic components. However, in order to maintain the liquid cooling apparatus with good circulation and cooling ability, the pump should be kept in full operation speed, but that will largely affect the life span and the operation efficiency of the pump, and it will cause damage to the pump. Consequently, users have to dismantle the liquid cooling apparatus to replace the damaged pump, which is inconvenient to users. Hence, in order to extend the life span of the cooling device, manufacturers are constantly trying to improve the cooling efficiency of the cooling device as well as reducing the loading of the pump for extending the life span of the pump.

SUMMARY

An embodiment of the disclosure provides a liquid cooling apparatus including a heat exchange module and a cooling module. The heat exchange module includes a liquid inlet and a liquid outlet. The cooling module includes a first body, a second body, a first cooling component and a cooling duct. The first body is connected to the liquid outlet. The second body is connected to the liquid inlet. The first body is disposed above the second body. The first cooling component is disposed between the first body and the second body. The cooling duct is connected to the first body and the second body, and the cooling duct is in thermal contact with the first cooling component.

An embodiment of the disclosure provides a liquid cooling apparatus including a heat exchange module and a plurality of cooling modules. The heat exchange module includes a liquid inlet and a liquid outlet. Each of the cooling modules includes a first body, a second body, a cooling component and a cooling duct. The first body is disposed above the second body. The cooling component is disposed between the first body and the second body. The cooling duct is connected to the first body and the second body, and the cooling duct is in thermal contact with the first cooling component. The cooling modules are arrayed in a serial connection. The first body of one of the cooling modules is connected to the liquid outlet, and the second body of another one of the cooling modules is connected to the liquid inlet.

An embodiment of the disclosure provides a liquid cooling apparatus including a heat exchange module and a plurality of cooling modules. The heat exchange module includes a liquid inlet and a liquid outlet. Each of the cooling modules includes a first body, a second body, a cooling component and a cooling duct. The first body is disposed above the second body. The cooling component is disposed between the first body and the second body. The cooling duct is connected to the first body and the second body, and the cooling duct is in thermal contact with the first cooling component. The cooling modules are arrayed in a parallel connection. The first body of each of the cooling modules is connected to the liquid outlet, and the second body of each of the cooling modules is connected to the liquid inlet.

An embodiment of the disclosure provides a liquid cooling apparatus including a plurality of heat exchange modules and a cooling module. Each of the heat exchange modules includes a liquid inlet and a liquid outlet. The cooling module includes a first body, a second body, a cooling component and a cooling duct. The first body is connected to the liquid outlet of each of the heat exchange modules. The second body is connected to the liquid inlet of each of the heat exchange modules. The first body is disposed above the second body. The cooling component is disposed between the first body and the second body. The cooling duct is connected to the first body and the second body, and the cooling duct is in thermal contact with the first cooling component.

DETAILED DESCRIPTION

In the following detailed description, for purposes of explanation, numerous specific details are set forth in order to provide a thorough understanding of the disclosed embodiments. It will be apparent, however, that one or more embodiments can be practiced without these specific details. In other instances, well-known structures and devices are schematically shown in order to simplify the drawings.

Figure 1A:
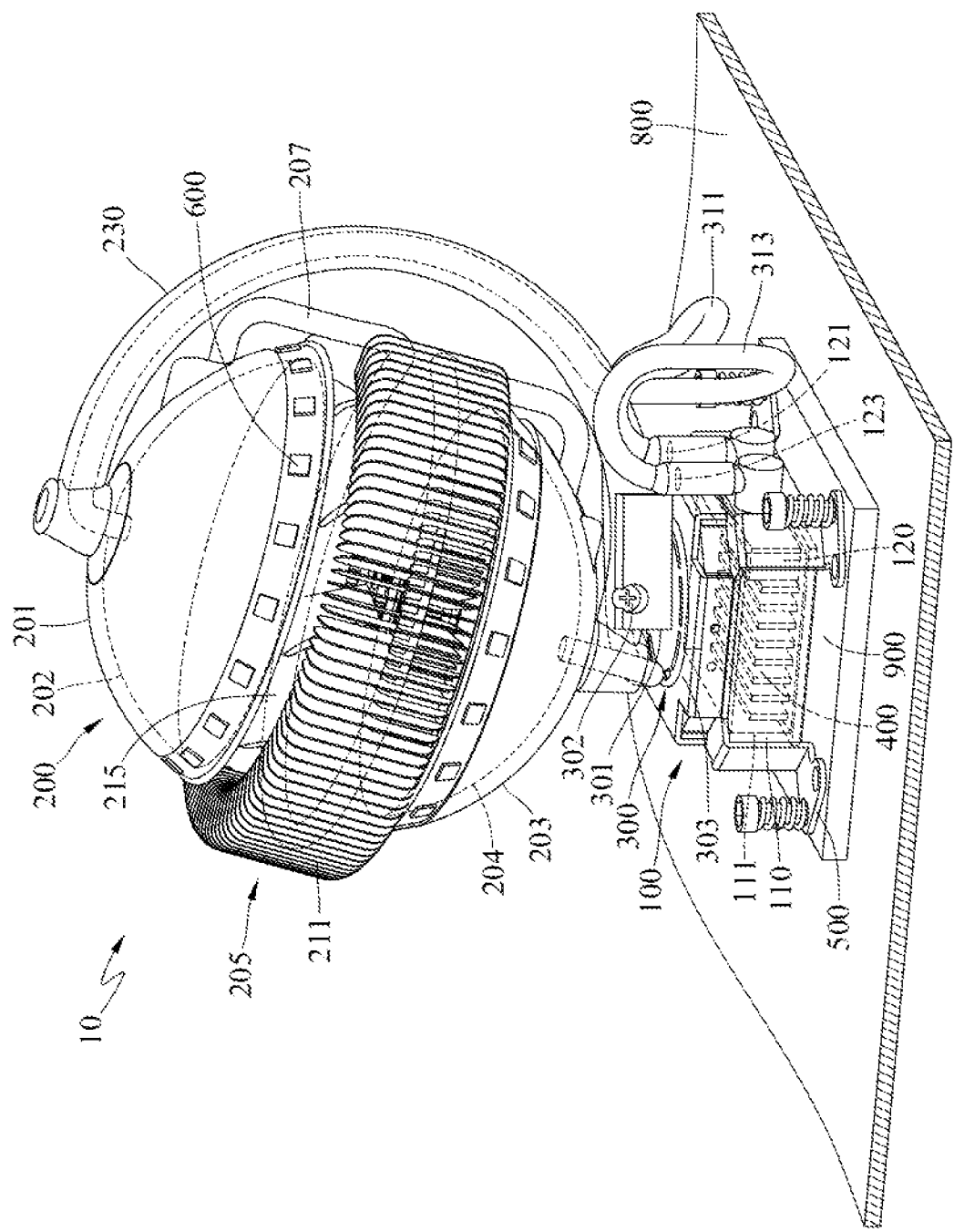
FIG. 1A is a perspective view of a liquid cooling apparatus according to a first embodiment of the disclosure.
Figure 1B:
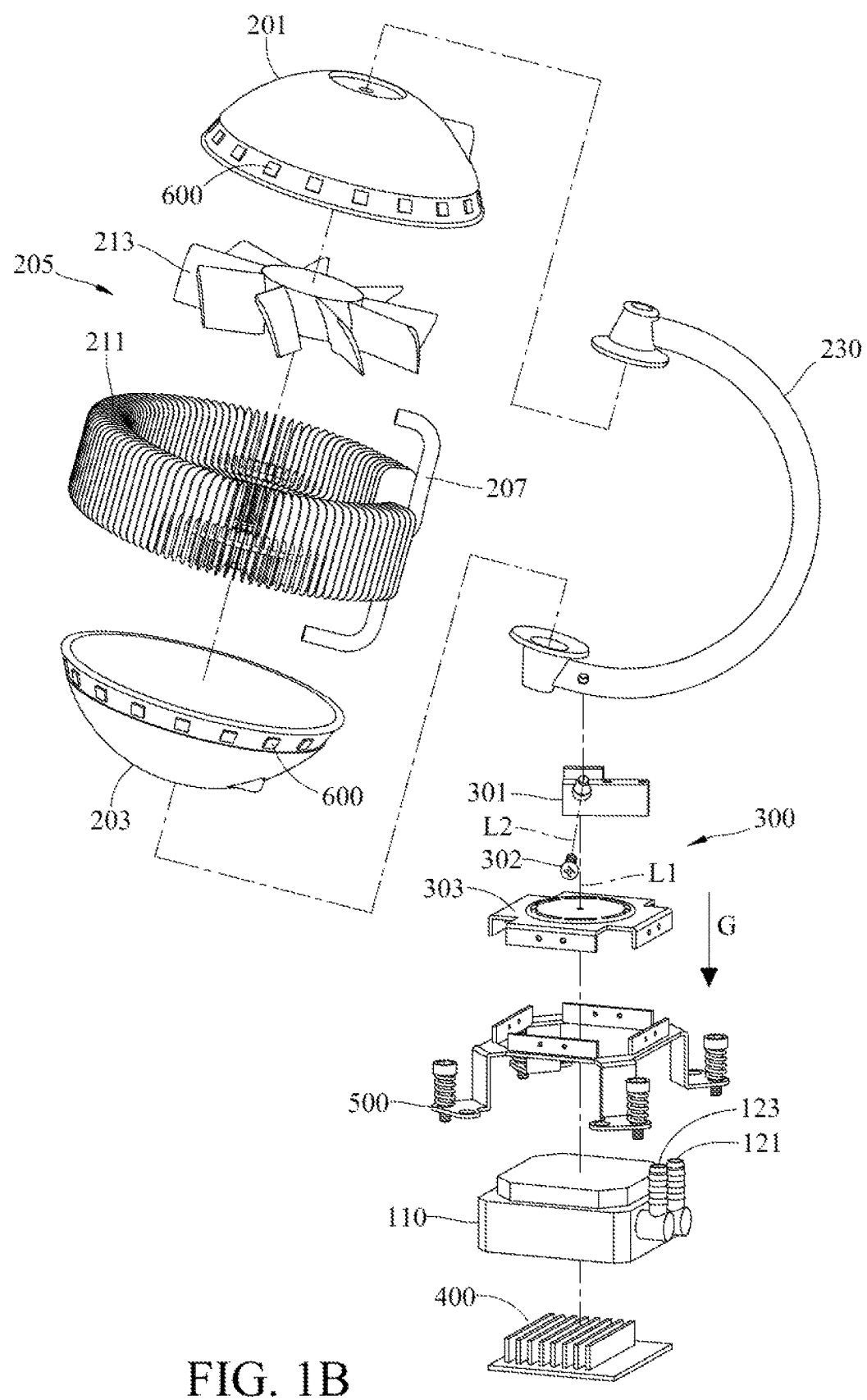
FIG. 1B is an exploded view of the liquid cooling apparatus according to the first embodiment of the disclosure.

Please refer to FIG. 1A and FIG. 1B. FIG. 1A is a perspective view of a liquid cooling apparatus according to a first embodiment of the disclosure. FIG. 1B is an exploded view of the liquid cooling apparatus according to the first embodiment of the disclosure. The disclosure provides a liquid cooling apparatus 10 including a heat exchange module 100 and a cooling module 200.

The heat exchange module 100 is in thermal contact with a heat source 900 for exchanging heat with the heat source 900. In detail, the heat exchange module 100 includes a heat exchange body 110 and a pump 120. In this and some embodiments, the heat exchange module 100 further includes a plurality of hook members 500. The hook members 500 are disposed on the heat exchange module 100. Specifically, the hook members 500 are disposed on the heat exchange body 110 for hooking the heat source 900 onto a circuit board 800, and thus the heat exchange body 110 is in thermal contact with the heat source 900 on the circuit board 800. In this embodiment and some embodiments, for example, the hook members 500 are able to fix on different environments, e.g., circuit boards in computers or servers. For example, the heat source 900 is a central processing unit (CPU) or a display card. The pump 120 is used for driving working fluid. For example, the working fluid is water or cooling liquid.

In this embodiment, the heat exchange module 100 includes a liquid inlet 121 and a liquid outlet 123. The liquid inlet 121 and liquid outlet 123 are disposed on the pump 120. The working fluid is able to flow through the liquid inlet 121 and the liquid outlet 123. For example, the liquid inlet 121 and the liquid outlet 123 are connected to ducts, multiple joints or other chamber bodies, respectively.

In addition, the heat exchange body 110 is connected to the pump 120. The heat exchange body 110 includes a heat exchange space 111. The heat exchange space 111 is used for accommodating the working fluid and connecting to the liquid inlet 121 and the liquid outlet 123 of the pump 120. Therefore, the working fluid is able to flow into the heat exchange space 111 of the heat exchange body 110 via the liquid inlet 121 of the pump 120, and flow out from the heat exchange body 110 via the liquid outlet 123 of the pump 120.

The cooling module 200 includes a first body 201, a second body 203, a first cooling component 205 and a cooling duct 207.

In this embodiment, the first body 201 includes a first space 202. The second body 203 includes a second space 204. The first space 202 and the second space 204 are used for accommodating the working fluid. The cooling duct 207 is made of copper or copper alloys.

The cooling duct 207 is connected to the first body 201 and the second body 203. In detail, the cooling duct 207 respectively communicates with the first space 202 and the second space 204, and thus the first space 202 communicates with the second space 204 via the cooling duct 207. In addition, both the first body 201 and the second body 203 have the spaces for accommodating the working fluid, and thus the liquid cooling apparatus 10 is able to accommodate more working fluid than a traditional liquid cooling apparatus which has only one storage space (e.g. tank). Consequently, in this embodiment, the liquid cooling apparatus 10 is able to accommodate more working fluid, and this allows users not to replenish the working fluid too often and improves the cooling efficiency.

The first cooling component 205 includes a cooling fin set 211 and a fan 213. A plurality of cooling fins integrates into the cooling fin set 211 which is, for example, an annular shape. For example, the fan 213 is an axial flow fan. The fan 213 is for generating air currents to the cooling fin set 211. The air currents flow through spaces between each of the cooling fins to take away heat from the cooling fin set 211.

In addition, the cooling fin set 211 surrounds the fan 213, for example, the fan 213 is disposed at a center of the annular-shaped cooling fin set 211. For example, the fan 213 is able to generate the air currents flowing along a direction from top to bottom or a direction from bottom to top according to requirements of users.

In this embodiment, the first body 201 is disposed above the second body 203, the first cooling component 205 is disposed between the first body 201 and the second body 203, and the cooling duct 207 is in thermal contact with the first cooling component 205.

In this embodiment, an absolute altitude of the first body 201 is higher than an absolute altitude of the second body 203. For example, the first body 201 is superposed above the second body 203. The cooling duct 207 is in thermal contact with the cooling fin set 211 by an interlocking or a soldering manner to transfer heat from the cooling duct 207 to the cooling fin set 211. For example, the cooling duct 207 is fixed to the cooling fin set 211 via the cooling duct 207 penetrating through centers of each of the cooling fins of the cooling fin set 211, but the disclosure is not limited to the above-mentioned configurations. It is understood by people of ordinary skill in the art that the structures or combinations which improves the cooling efficiency of the cooling duct 207 are included within the scope of the present disclosure.

In this embodiment, the first body 201 is connected to the liquid outlet 123, and the second body 203 is connected to the liquid inlet 121. In detail, the liquid cooling apparatus 10 further includes an outlet duct 313 and an inlet duct 311. The outlet duct 313 communicates with the first space 202 of the first body 201, and the inlet duct 311 communicates with the second space 204 of the second body 203. That is, the outlet duct 313 is connected to the first body 201 and the liquid outlet 123, and the inlet duct 311 is connected to the second body 203 and the liquid inlet 121.

Accordingly, since the heat exchange module 100 communicates with the first body 201, the cooling duct 207 and second body 203, the working fluid is circulated between the heat exchange module 100 and the cooling module 200. For example, the working fluid is moved to circulate by the mechanical force provided by the pump 120. Due to the circulation of the working fluid, consumption and costs of the working fluid are reduced.

In addition, in this embodiment, there is a difference of the altitudes between the first body 201 and the second body 203. That is, when the working fluid flows from the first body 201 to the second body 203, the working fluid is accelerated to flow to the heat exchange module 100 fast due to the gravitational acceleration resulted from the difference of altitudes. Consequently, the cooling efficiency is improved, and the loading of the pump 120 for driving the working fluid is reduced. In such a manner, the energy which is used for driving the pump 120 is saved, and the life span the pump 120 is increased to reduce costs of maintenance.

Furthermore, the first cooling component 205 is respectively indirectly connected to the first body 201 and the second body 203. For example, there are two gaps 215 respectively formed between the first body 201 and the first cooling component 205, and between the second body 203 and the first cooling component 205. The width of each of the gaps 215 is about 4 to 5 millimeters, and the two gaps 215 are used as channels for airflow. For example, air currents flow out of the cooling module 200 via the gaps 215, or cold air is able to flow into the cooling module 200 via the gaps 215. Accordingly, air currents flow to electronic components in the vicinity of the liquid cooling apparatus 10 via the channels which are respectively formed by the two gaps 215 for cooling the electronic components.

In this embodiment, the liquid cooling apparatus 10 further includes a pivoting mechanism 300. The pivoting mechanism 300 includes a vertical pivoting seat 301 and a horizontal turntable 303.

With respect to relative positions of the cooling module 200 and the pivoting mechanism 300, the cooling module 200 is located above the pivoting mechanism 300. That is, the cooling module 200 is located above the vertical pivoting seat 301 and the horizontal turntable 303. In addition, the vertical pivoting seat 301 is pivotally connected to the cooling module 200, the vertical pivoting seat 301 is disposed on the horizontal turntable 303, and the horizontal turntable 303 is disposed on the heat exchange body 110. In detail, the vertical pivoting seat 301 is fastened to the horizontal turntable 303 for performing a horizontally rotating movement. The aforementioned horizontal rotating movement is that the vertical pivoting seat 301 is rotated about a first axis L1 which is parallel to the direction of gravity G, i.e., the vertical pivoting seat 301 is rotated horizontally. The vertical pivoting seat 301 includes a pivot 302. The cooling module 200 is pivotally connected to the vertical pivoting seat 301 by the pivot 302 for performing a vertical pivoting movement. The aforementioned vertical pivoting movement is that the cooling module 200 is pivoted about a second axis L2 which is perpendicular to the direction of gravity G, i.e., the cooling module 200 is pivoted vertically.

In some embodiments, the vertical pivoting seat 301 and the horizontal turntable 303 are integrated into a single mechanism. For example, the pivoting mechanism 300 is a universal joint for performing the horizontal rotating movement and the vertical pivoting movement.

In this embodiment, the cooling module 200 further includes a mounting 230 having two ends. The two ends of the mounting 230 are respectively disposed on the first body 201 and the second body 203. The cooling module 200 is pivotally connected to the vertical pivoting seat 301 of the pivoting mechanism 300 via the mounting 230. Specifically, the vertical pivoting seat 301 is pivotally connected to an end of the mounting 230 adjacent to the second body 203. In addition, a part of the outlet duct 313 is disposed inside the mounting 230. In other words, a part of the outlet duct 313 is stored in the mounting 230. In this and some embodiments, the mounting 230 is C-shaped, and both the first body 201 and the second body 203 are hemispherical shaped. Thus, the first body 201, the second body 203 and the mounting 230 are integrated to form a globe-like sphere, which has a novel and aesthetic appearance. However, the disclosure is not limited to the aforementioned shapes.

Accordingly, it is understood by people in the skill of art that the pivoting mechanism 300 is used for connecting the heat exchange module 100 and the cooling module 200, and thus the cooling module 200 is able to perform the vertical pivoting movement and the horizontal rotating movement relative to the heat exchange module 100 by the vertical pivoting seat 301 and the horizontal turntable 303.

Figure 1C:
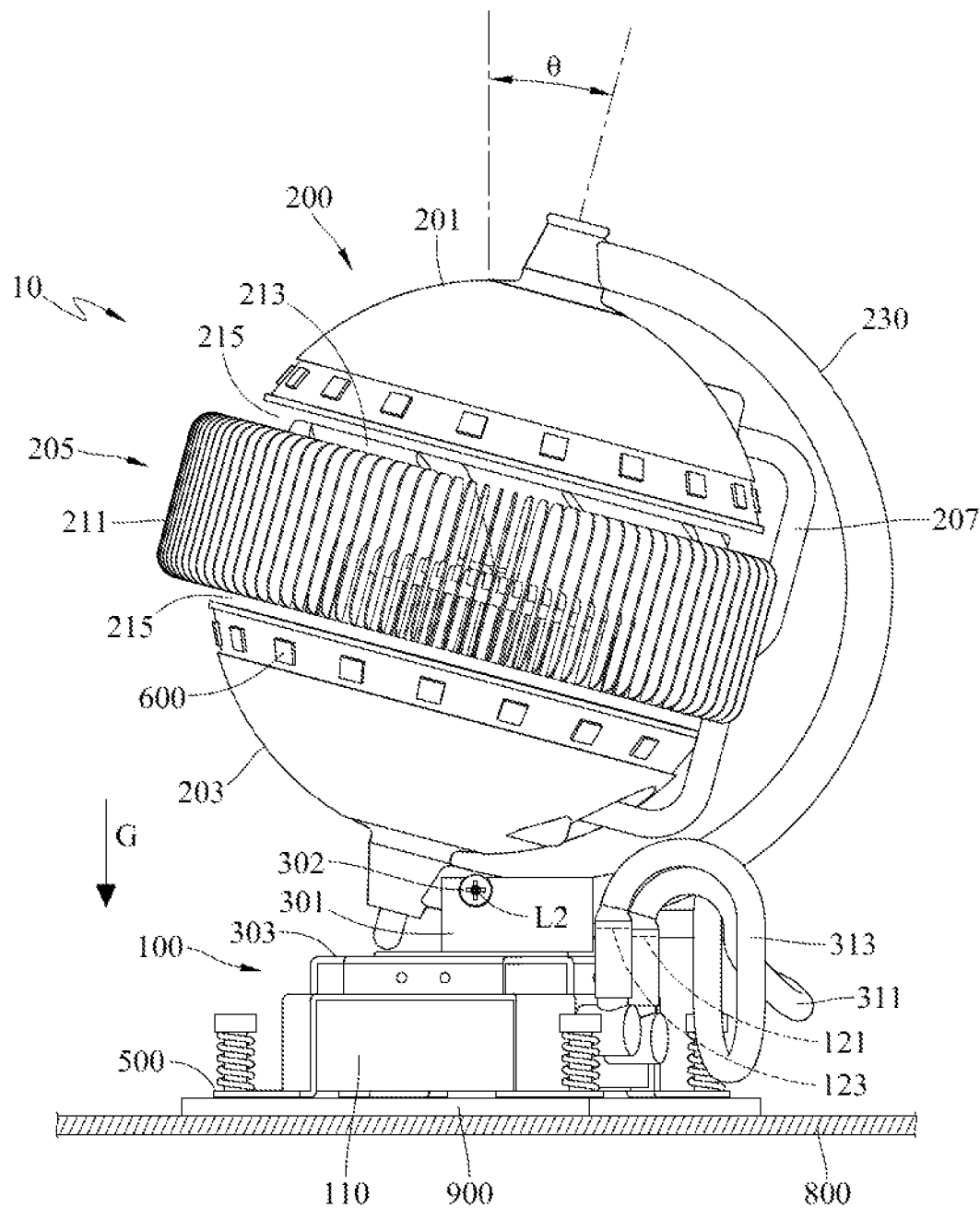
FIG. 1C is a side view of a cooling module of the liquid cooling apparatus which is placed in an inclined state according to the first embodiment of the disclosure.
Figure 1D:
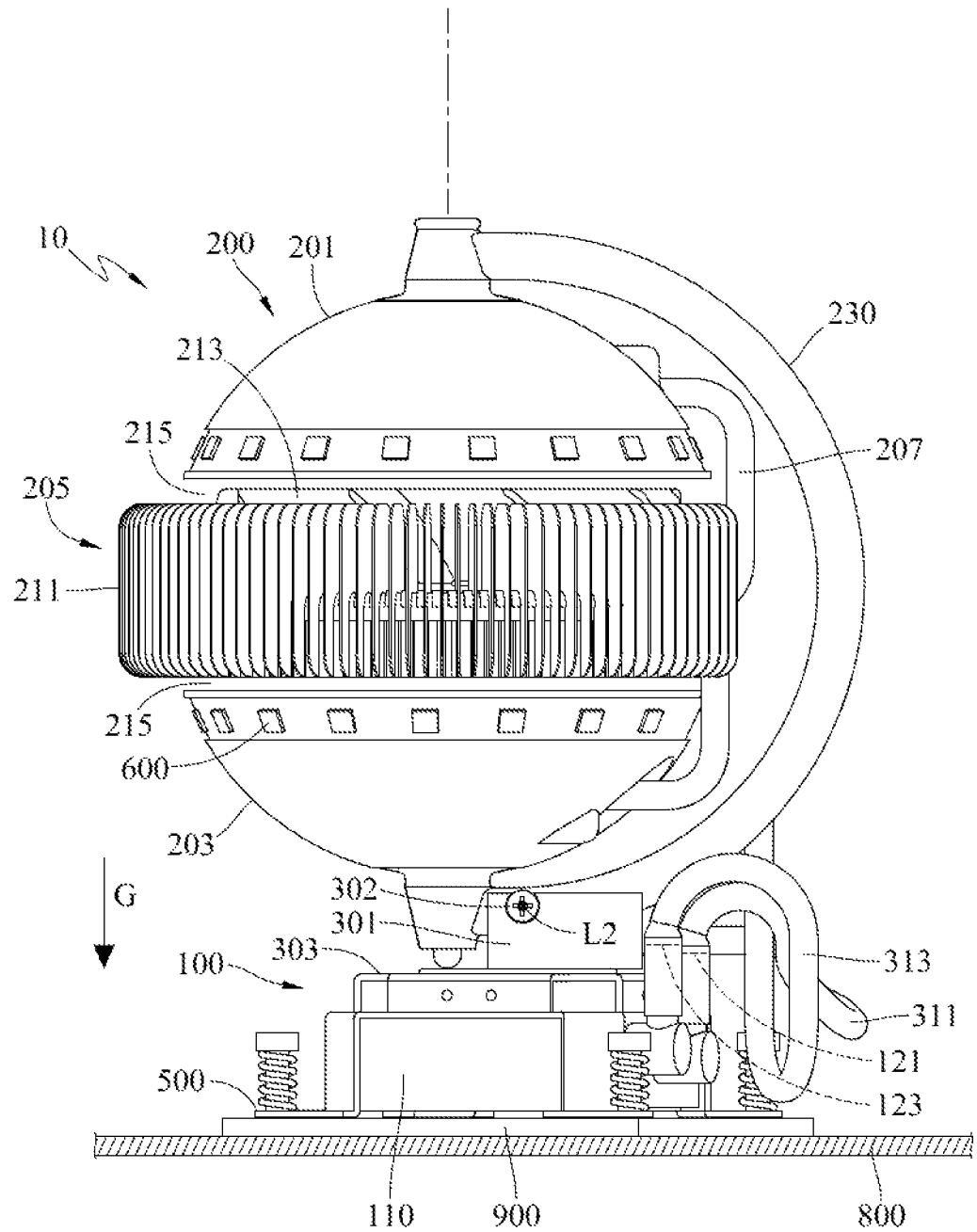
FIG. 1D is a side view of the cooling module of the liquid cooling apparatus which is placed in an upright state according to the first embodiment of the disclosure.

Then, please refer to FIG. 1C and FIG. 1D, FIG. 1C is a schematic view of a cooling module of the liquid cooling apparatus which is placed in an inclined state according to the first embodiment of the disclosure, and FIG. 1D is a schematic view of the cooling module of the liquid cooling apparatus which is placed in an upright state according to the first embodiment of the disclosure. The cooling module 200 is able to perform the vertical pivoting movement or the horizontal rotating movement relative to the heat exchange module 100. Users thus are able to adjust angles of the cooling module 200 according to different designs. For example, the cooling module 200 is rotated vertically to be placed in the inclined state via the vertical pivoting seat 301, i.e., the cooling module 200 is placed in the inclined state by pivoting about the second axis L2 which is perpendicular to the direction of gravity G, as shown in FIG. 1C, a connecting line between a center of the first body 201 and a center of the second body 203 and the direction of gravity G form an angle θ therebetween. Thus, the air currents blown from the gaps 215 are altered to flow in another direction, so that the directions of the air currents are adjusted toward the electronic components in the vicinity of the cooling module 200 for removing heat from the electronic components. However, the adjustments do not affect the heat dissipation of the liquid cooling apparatus 10. Also, users are able to adjust the direction of the air currents produced from the cooling module 200 to cooperate with a direction of air currents produced from a main fan in the electronic device. When the direction of the air currents produced from the cooling module 200 are substantially the same as the direction of the air currents produced from the main fan, a total amount of wind flowing to the first cooling component 205 is increased, so that the cooling ability is enhanced, and the cooling efficiency is improved.

Furthermore, angles of the cooling module 200 are adjusted to avoid colliding or contacting with the electronic components in the vicinity thereof. Even more, when heat which is generated from the heat source 900, e.g. the central processing unit, is less than usual, the cooling module 200 is placed in the inclined state to shorten the vertical distance between the liquid outlet 123 and the first body 201. Therefore, the loading of the pump 120 for driving the working fluid upward is reduced. In other words, the pump 120 is able to apply a lighter force to drive the working fluid to move to the first body 201 via the liquid outlet 123. In this disclosure, the vertical distance is defined to be a distance of a line parallel to the direction of gravity G.

On the other hand, the cooling module 200 is placed in the upright state when heat, which is generated from the heat source 900, is increased. As shown in FIG. 1D, the connecting line between the center of the first body 201 and the center of the second body 203 is parallel to the direction of gravity G, thus the vertical distance between the first body 201 and the second body 203 is increased. That is to say, the velocity of the working fluid is accelerated by the increase of the potential energy, thereby improving the cooling efficiency of the cooling module 200.

In addition, in this embodiment, the liquid cooling apparatus 10 is an independent module, and the cooling module 200 is adjustable for avoiding colliding or contacting with electronic components in the vicinity thereof. Compared to traditional fixed-type cooling modules, the liquid cooling apparatus 10 is utilized in different kinds of environments which are required to be cooled. For example, the liquid cooling apparatus 10 is mounted in an apparatus, such as, a computer or server.

Please refer to FIG. 1B and FIG. 1C. In this embodiment, the liquid cooling apparatus 10 further includes a second cooling component 400. The second cooling component 400 can be, but not limited to, a cooling fin set which includes a plurality of cooling fins. In this and some embodiments, since the second cooling component 400 is disposed in the heat exchange space 111 of the heat exchange body 110, there are more contact areas between the second cooling component 400 and a bottom part of the heat exchange body 110. Therefore, when the heat exchange body 110 is in thermal contact with the heat source 900 to absorb heat, the heat is transferred to the second cooling component 400. Then, the heat is taken away via the working fluid flowing through the second cooling component 400, so that the heat generated from the heat source 900 is consistently removed, and the heat source 900 is cooled. Any heat dissipation structure attached to the heat exchange body 110 with good thermal conductivity is included within the scope of the present disclosure.

In this and some embodiments, the liquid cooling apparatus 10 further includes a plurality of light emitting diodes 600. The light emitting diodes 600 are disposed on the surfaces of at least one of the first body 201 and the second body 203. For example, the light emitting diodes 600 are embedded on the first body 201 and the second body 203. Moreover, the light emitting diodes 600 are connected to a heat detection unit (not shown) for detecting temperatures of the working fluid in different positions inside the liquid cooling apparatus 10. Accordingly, the heat detection unit is able to inform users a present cooling situation of the cooling module 200 by changing colors of light which is emitted by the light emitting diodes 600.

In this and some embodiments, the first body 201 and the second body 203 are made of a material capable of being pervious to light. For example, the material is translucent or transparent. In detail, the working fluid is dyed according to demands of the users, and thus the dyed working fluid can be seen through the first body 201 and the second body 203 which are pervious to light, to realize the aesthetic appearance. Also, the working fluid can be mixed with thermochromic materials, and the working fluid thus is able to change colors when the working fluid flows through different areas with different temperatures. Therefore, a color-changing of the working fluid is observed through the first body 201 and the second body 203 which are pervious to light, so that the present cooling situation of the cooling module 200 is estimated by human eye.

In addition, in this and some embodiments, materials of the first body 201 and the second body 203 are mixed with thermochromic materials in an injection molding procedure, and thus a temperature variation of the working fluid flowing in the liquid cooling apparatus 10 is observed from the outside of the liquid cooling apparatus 10.

Furthermore, in this and some embodiments, the working fluid is a refrigerant, e.g., Dichlorodifluoromethane (R-12). Under atmospheric pressure, the refrigerant R-12 has a two-phase temperature range, a gaseous phase and a liquid phase. The boiling point is about −30 degrees Celsius and the refrigerant has a high condensation temperature. Therefore, the refrigerant R-12 is transformed from the liquid phase to the gaseous phase when flowing through the heat exchange body 110 absorbing heat. Consequently, the refrigerant R-12 is actively circulated to the cooling module 200 because of the refrigerant R-12 is vaporized to flow to the cooling module 200, so that the loading of the pump 120 is reduced. In such a case, in some embodiments, the liquid cooling apparatus 10 does not include the pump 120, and the working fluid is able to circulate in the liquid cooling apparatus 10 because of the phase change of the working fluid.

Figure 2:
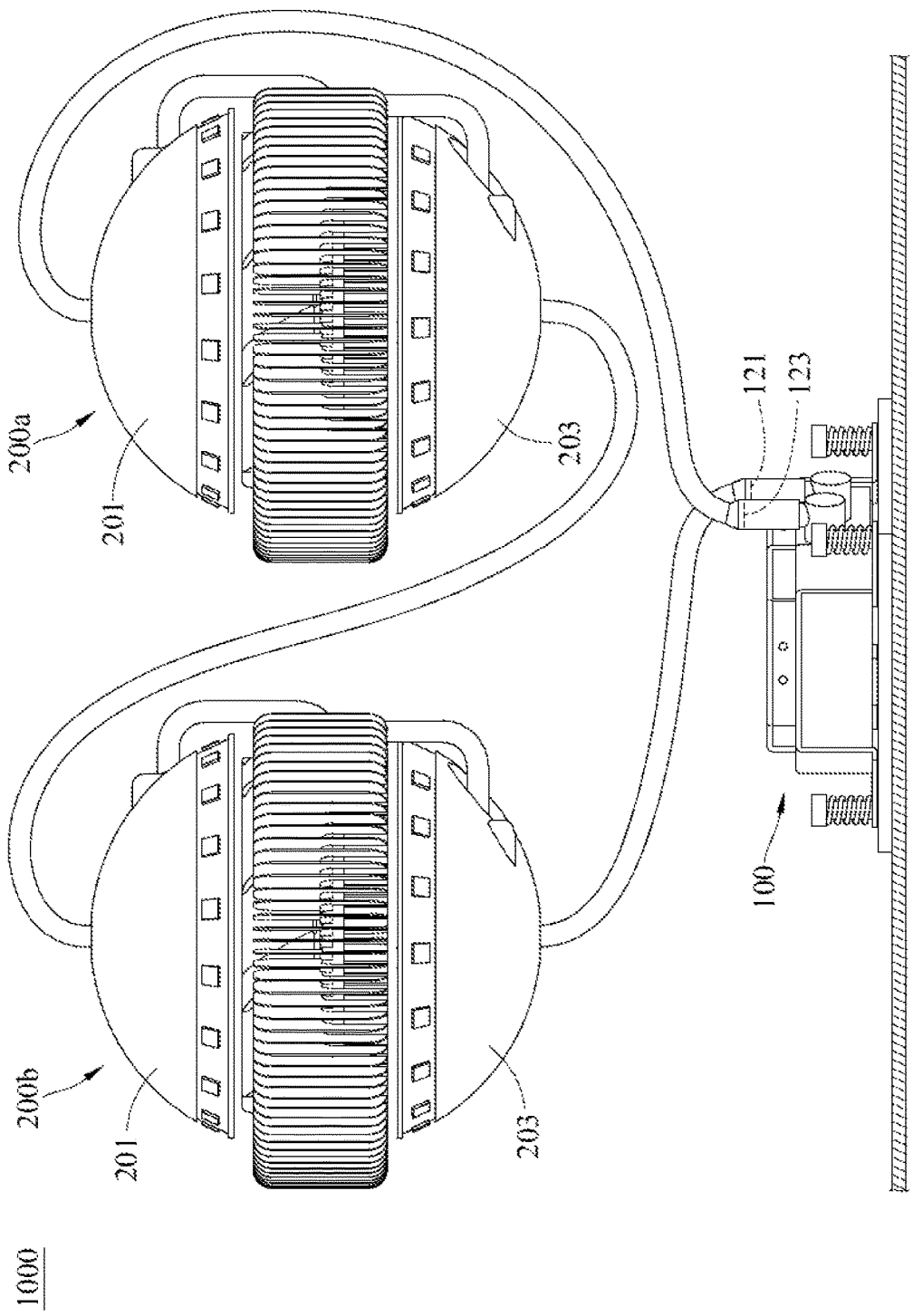
FIG. 2 is a side view of a liquid cooling apparatus according to a second embodiment of the disclosure.

Please refer to FIG. 2, which is a perspective view of a liquid cooling apparatus according to a second embodiment of the disclosure. This embodiment provides two cooling modules connected in series and then connecting to one heat exchange module. Since the cooling modules and the heat exchange module have been described in the first embodiment as shown in FIG. 1, therefore, the parts in the first embodiment which are the same as the second embodiment will not be further described.

In detail, the second embodiment has some differences with respect to the first embodiment. As shown in FIG. 2, the second embodiment provides a liquid cooling apparatus 1000 including at least two cooling modules which are connected in series, e.g., a cooling module 200a and a cooling module 200b. The first body 201 of the cooling module 200a is connected to the liquid outlet 123, the second body 203 of the cooling module 200a is connected to the first body 201 of the cooling module 200b, and the second body 203 of the cooling module 200b is connected to the liquid inlet 121. Thus, the liquid cooling apparatus 1000 including two cooling modules is connected to one heat exchange module 100. In addition, even though the liquid cooling apparatus 1000 as shown in FIG. 2 depicts one heat exchange module connecting to two cooling modules connected in series, but people skilled in the art is capable of connecting more than two cooling modules in the serial connection by referring FIG. 2.

In addition, when one fan of one of the cooling modules is failed, fans of other cooling modules which operate normally still are able to maintain the heat dissipation of the cooling device. It is understood by people skilled in the art that the cooling modules connected in series shown in FIG. 2 is only for illustrative purposes, and thus descriptions that the cooling modules are fixed to bearing seats (not shown) are not further explained.

The disclosure is not limited to the quantity of the pumps, as long as power of the pumps is able to drive the working fluid. Also, the disclosure is not limited to the quantity of the cooling modules, either. Moreover, the disclosure is not limited to directions and positions of installations of other components and configurations of the ducts.

Figure 3:
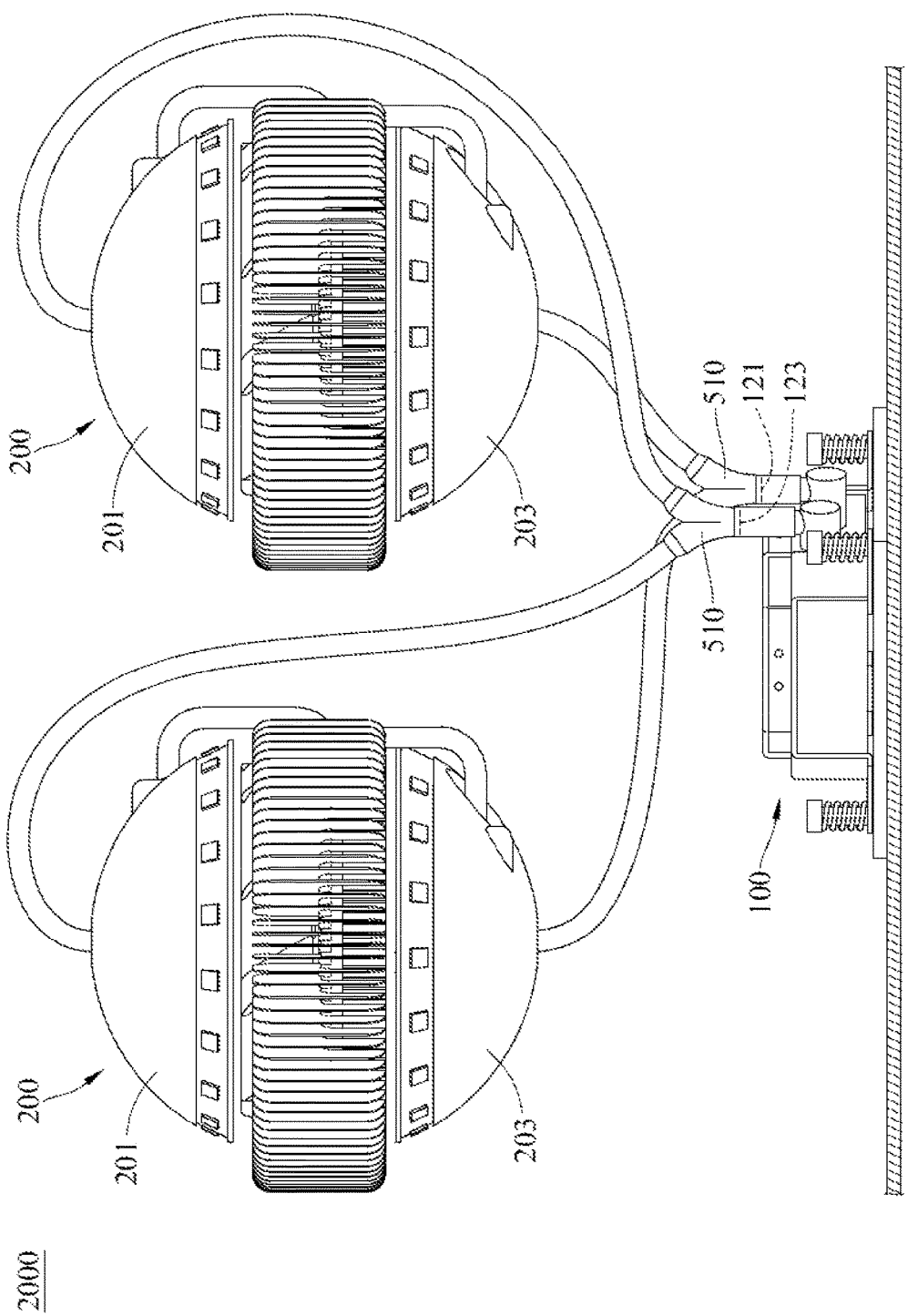
FIG. 3 is a side view of a liquid cooling apparatus according to a third embodiment of the disclosure.

Then, please refer to FIG. 3, which is a perspective view of a liquid cooling apparatus according to a third embodiment of the disclosure. This embodiment provides two cooling modules connected in parallel, and connecting to one heat exchange module. Since the cooling modules and the heat exchange module have been described in the first embodiment as shown in FIG. 1, the parts in the first embodiment which are the same as the third embodiment will not be further described.

In detail, the third embodiment has some differences with respect to the first embodiment. The third embodiment provides a liquid cooling apparatus 2000 including at least two cooling modules which are connected in parallel. Multiple joints 510 each with specific amount of ports are respectively disposed on the liquid inlet 121 and the liquid outlet 123. Thus all the first bodies 201 of the cooling modules 200 are connected to the liquid outlet 123, and all the second bodies 203 of the cooling modules 200 are connected to the liquid inlet 121. Accordingly, each of the cooling modules is able to communicate with the heat exchange module 100. It is understood by people skilled in the art that the cooling modules connected in parallel shown in FIG. 3 is only for illustrative purposes, and thus the descriptions that the cooling modules are fixed on bearing seats (not shown) are not further explained.

The disclosure is not limited to the quantity of the cooling modules. Moreover, the disclosure is not limited to directions and positions of installations of other components and configurations of the ducts.

Figure 4:
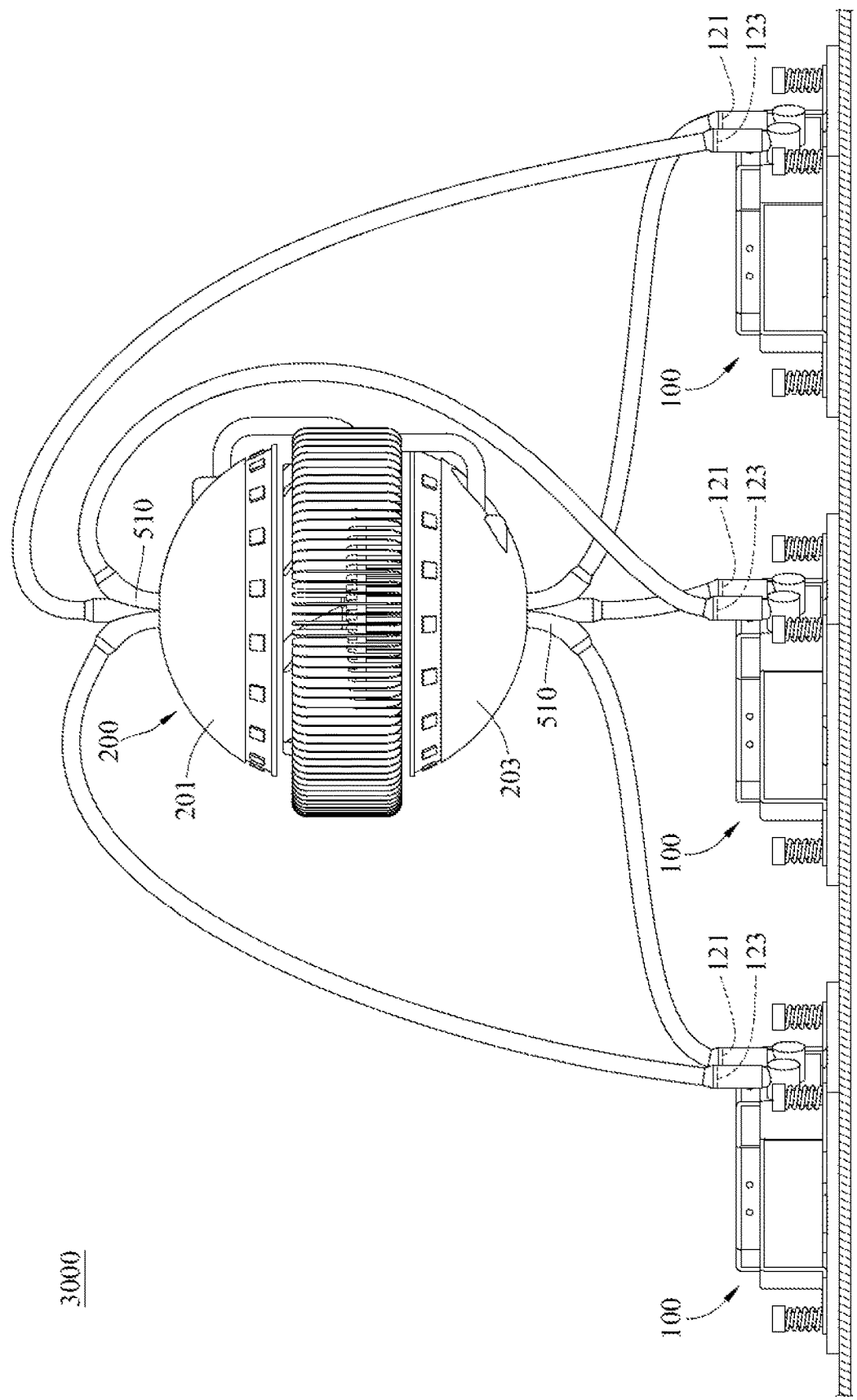
FIG. 4 is a side view of a liquid cooling apparatus according to a fourth embodiment of the disclosure.

Furthermore, please refer to FIG. 4, which is a perspective view of a liquid cooling apparatus according to a fourth embodiment of the disclosure. This embodiment provides a plurality of heat exchange modules connecting to one cooling module. Since the heat exchange modules and the cooling module have been described in the first embodiment as shown in FIG. 1, the parts in the first embodiment which are the same as the forth embodiment will not be further described.

In detail, the fourth embodiment has some differences with respect to the first embodiment. The forth embodiment provides a liquid cooling apparatus 3000 including a plurality of heat exchange modules 100 and one cooling module 200. As shown in FIG. 3, the first body 201 is connected to the liquid outlets 123 of each of the heat exchange modules 100, and the second body 203 is connected to the liquid inlets 121 of each of the heat exchange modules 100. Multiple joints 510 each with specific amount of ports are respectively disposed on the first body 201 and the second body 203, and thus the first body 201 and the second body 203 are respectively connected with at least one duct. Accordingly, the cooling module 200 is connected through each of the heat exchange modules 100. It is noted that the heat exchange modules 100 are not directly connected to each other.

In addition, when the pump 120 of one of the heat exchange modules 100 has failed, the other pumps 120 of rest of the heat exchange modules 100 which operate normally are able to maintain the working fluid to circulate in the cooling device. It is understood by people skilled in the art that the cooling module connecting to the several heat exchange modules shown in FIG. 4 is only for illustrative purposes, and thus the description that the cooling module is fixed on the bearing seat (not shown) is not further explained The disclosure is not limited to the amount of the heat exchange modules 100, users are able to equip more or fewer heat exchange modules according to a loading ability of the cooling module 200. The disclosure is not limited to directions and positions of installations of cooling modules and the heat exchange module and configurations of the ducts.

According to the liquid cooling apparatus as discussed above, the working fluid flowing from the first body to the second body is accelerated due to the attraction of gravity resulted form the difference of altitudes between the first body and the second body. Therefore, the cooling efficiency of the liquid cooling apparatus is improved, and the loading of the pump for driving the working fluid is reduced, so that the energy is saved.

In addition, the vertical distance between the liquid outlet and the first body is reduced by adjusting the inclination of the cooling module, in order to reduce the loading of the pump for driving the working fluid upward. On the other hand, the cooling module is placed in the upright state to increase the vertical distance of working fluid flowing from the first body to the second body. Thus, the flow velocity of the working fluid is accelerated by the increase of the potential energy, so that the cooling efficiency of the cooling module is improved.

What is claimed is:

1. A liquid cooling apparatus, comprising:
   a heat exchange module comprising a liquid inlet and a liquid outlet;
   a cooling module comprising:
      a first body being connected to the liquid outlet;
      a second body being connected to the liquid inlet, and the first body being disposed above the second body;
      a first cooling component being disposed between the first body and the second body, and
      a cooling duct connecting the first body and the second body, and the cooling duct being in thermal contact with the first cooling component, and
      a pivoting mechanism being connected to the heat exchange module and the cooling module.

2. The liquid cooling apparatus according to claim 1, wherein the heat exchange module further comprises a heat exchange body and a pump, the heat exchange body is connected to the pump.

3. The liquid cooling apparatus according to claim 1, wherein the pivoting mechanism comprises a vertical pivoting seat being pivotally connected to the cooling module.

4. The liquid cooling apparatus according to claim 1, wherein the pivoting mechanism comprises a horizontal turntable disposed on the heat exchange module, and the cooling module is located on the horizontal turntable.

5. The liquid cooling apparatus according to claim 1, wherein the cooling module further comprises a mounting having two ends, the two ends of the mounting are connected to the first body and the second body, respectively, and the pivoting mechanism is connected to the mounting of the cooling module.

6. The liquid cooling apparatus according to claim 1, wherein the pivoting mechanism comprises a horizontal turntable and a vertical pivoting seat, the horizontal turntable is disposed on the heat exchange module, the vertical pivoting seat is disposed on the horizontal turntable, the cooling module is located on the horizontal turntable, the cooling module further comprises a mounting having two ends, the two ends are connected to the first body and the second body, respectively, and the vertical pivoting seat is pivotally connected to the mounting.

7. The liquid cooling apparatus according to claim 5, further comprising an outlet duct and an inlet duct, a part of the outlet duct being disposed in the mounting, the outlet duct being connected to the first body and the liquid outlet, and the inlet duct being connected to the second body and the liquid outlet.

8. The liquid cooling apparatus according to claim 1, wherein the first cooling component comprises a cooling fin set and a fan, the cooling fin set surrounds the fan, and the cooling duct is in thermal contact with the cooling fin set.

9. The liquid cooling apparatus according to claim 2, further comprising a second cooling component being disposed in the heat exchange body.

10. The liquid cooling apparatus according to claim 1, further comprising a plurality of hook members being disposed on the heat exchange module, hook members being used for hooking a circuit board, and the heat exchange module being used for being in thermal contact with a heat source on the circuit board.

11. The liquid cooling apparatus according to claim 1, further comprising a plurality of light emitting diodes being disposed on at least one of the first body and the second body.

12. The liquid cooling apparatus according to claim 1, wherein the first body and the second body are made of a material capable of being pervious to light.

13. The liquid cooling apparatus according to claim 1, wherein the cooling duct is made of copper or copper alloy.

* * * * *